(12) United States Patent
Huang et al.

(10) Patent No.: US 12,032,296 B2
(45) Date of Patent: Jul. 9, 2024

(54) FLUID HANDLING SYSTEM, METHOD AND LITHOGRAPHIC APPARATUS

(71) Applicant: ASML NETHERLANDS B.V., Veldhoven (NL)

(72) Inventors: Yang-Shan Huang, Veldhoven (NL); Nicolaas Ten Kate, Almkerk (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/776,369

(22) PCT Filed: Oct. 12, 2020

(86) PCT No.: PCT/EP2020/078599
§ 371 (c)(1),
(2) Date: May 12, 2022

(87) PCT Pub. No.: WO2021/099027
PCT Pub. Date: May 27, 2021

(65) Prior Publication Data
US 2022/0397830 A1    Dec. 15, 2022

(30) Foreign Application Priority Data

Nov. 18, 2019 (EP) ..................... 19209814

(51) Int. Cl.
*G03F 7/00*    (2006.01)
(52) U.S. Cl.
CPC .......... *G03F 7/70341* (2013.01); *G03F 7/709* (2013.01)

(58) Field of Classification Search
CPC ... G03F 7/70341; G03F 7/709; G03F 7/70916
See application file for complete search history.

(56) References Cited

U.S. PATENT DOCUMENTS

| 5,610,683 A | * | 3/1997 | Takahashi | ........... G03F 7/70341 355/53 |
| 6,952,253 B2 | | 10/2005 | Lof et al. | |
| 8,564,759 B2 | * | 10/2013 | Chang | ....................... B08B 3/12 355/53 |
| 8,711,326 B2 | * | 4/2014 | Van Der Ham | .... G03F 7/70341 355/77 |

(Continued)

FOREIGN PATENT DOCUMENTS

| GB | 2269674 | 2/1994 |
| TW | 201133153 | 10/2011 |

(Continued)

OTHER PUBLICATIONS

Jan Molacek et al., "Drops Bouncing on a Vibrating Bath", J. Fluid Mech., vol. 727, pp. 582-611 (2013).

(Continued)

*Primary Examiner* — Hung V Nguyen
(74) *Attorney, Agent, or Firm* — Pillsbury Winthrop Shaw Pittman, LLP

(57) ABSTRACT

A fluid handling system that includes a liquid confinement structure configured to confine immersion liquid to a space between at least a part of the liquid confinement structure and a surface of a substrate. The fluid handling system also includes a mechanism configured to vibrate a vibration component in contact with the immersion liquid.

20 Claims, 8 Drawing Sheets

(56) References Cited

U.S. PATENT DOCUMENTS

| | | | |
|---|---|---|---|
| 9,463,398 B2 * | 10/2016 | Iwata | ................ B01D 19/0036 |
| 2006/0021642 A1 | 2/2006 | Sliwa et al. | |
| 2006/0103816 A1 | 5/2006 | Belfroid et al. | |
| 2006/0110689 A1 | 5/2006 | Chang | |
| 2006/0250588 A1 | 11/2006 | Brandl | |
| 2006/0290908 A1 | 12/2006 | De Graaf et al. | |
| 2009/0279062 A1 | 11/2009 | Direcks et al. | |
| 2011/0292357 A1 | 12/2011 | Van Der Ham et al. | |
| 2012/0019802 A1 | 1/2012 | Tanaka et al. | |
| 2012/0069309 A1 | 3/2012 | Willems et al. | |
| 2018/0329292 A1 | 11/2018 | Kanehara et al. | |

FOREIGN PATENT DOCUMENTS

| | | |
|---|---|---|
| TW | 201937299 | 9/2019 |
| WO | 99/49504 | 9/1999 |
| WO | 2019/115197 | 6/2019 |

OTHER PUBLICATIONS

International Search Report dated Feb. 9, 2021, issued in corresponding International Patent Application No. PCT/EP2020/078599 (3 pgs.).

Office Action dated Sep. 2, 2021, issued in corresponding Taiwanese Patent Application No. 109137654, with English translation (14 pgs.).

Written Opinion of the International Searching Authority dated Feb. 9, 2021, issued in corresponding International Patent Application No. PCT/EP2020/078599 (5 pgs.).

* cited by examiner

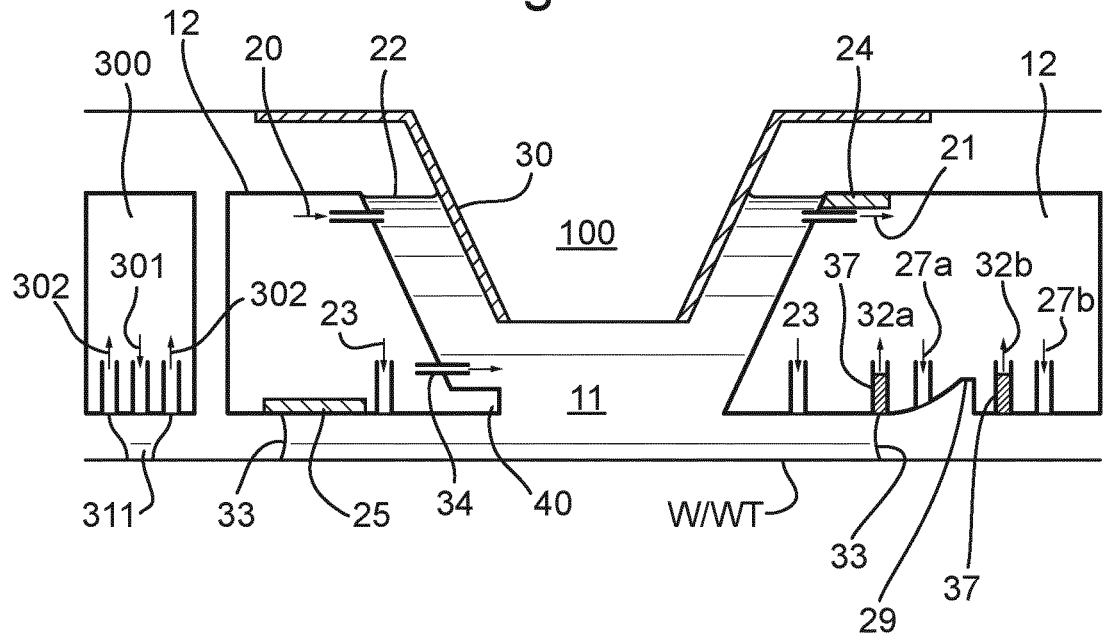
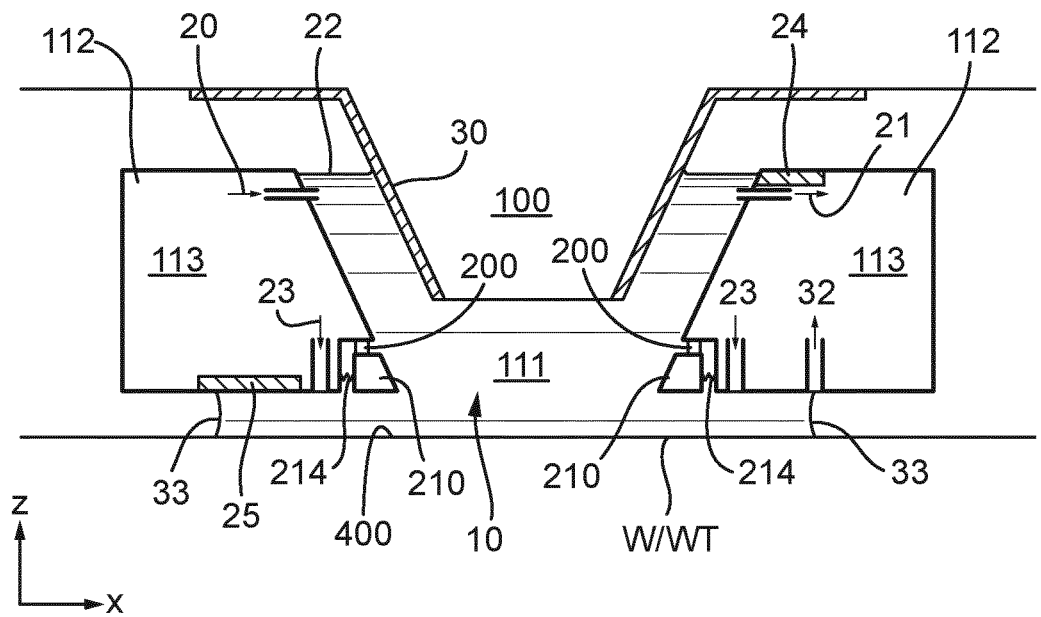

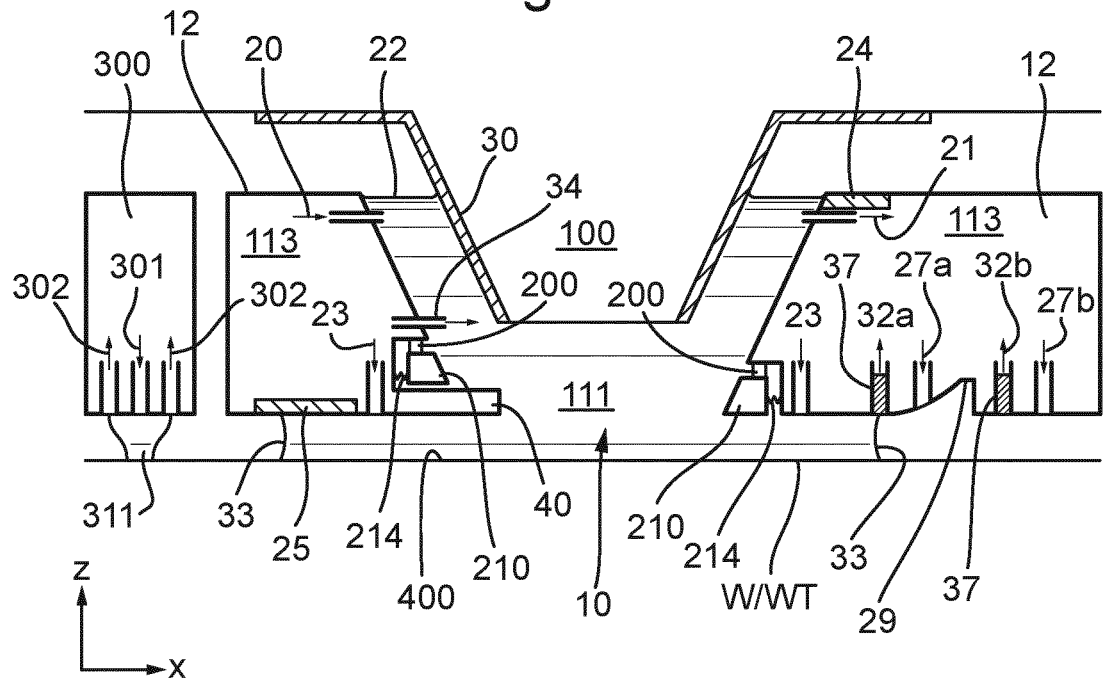
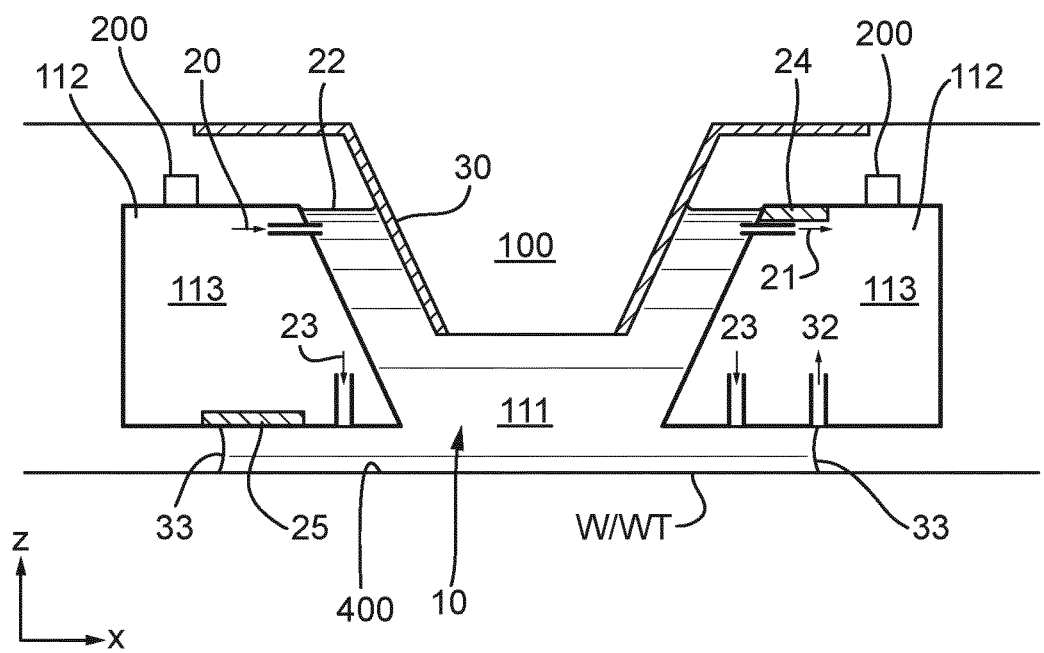

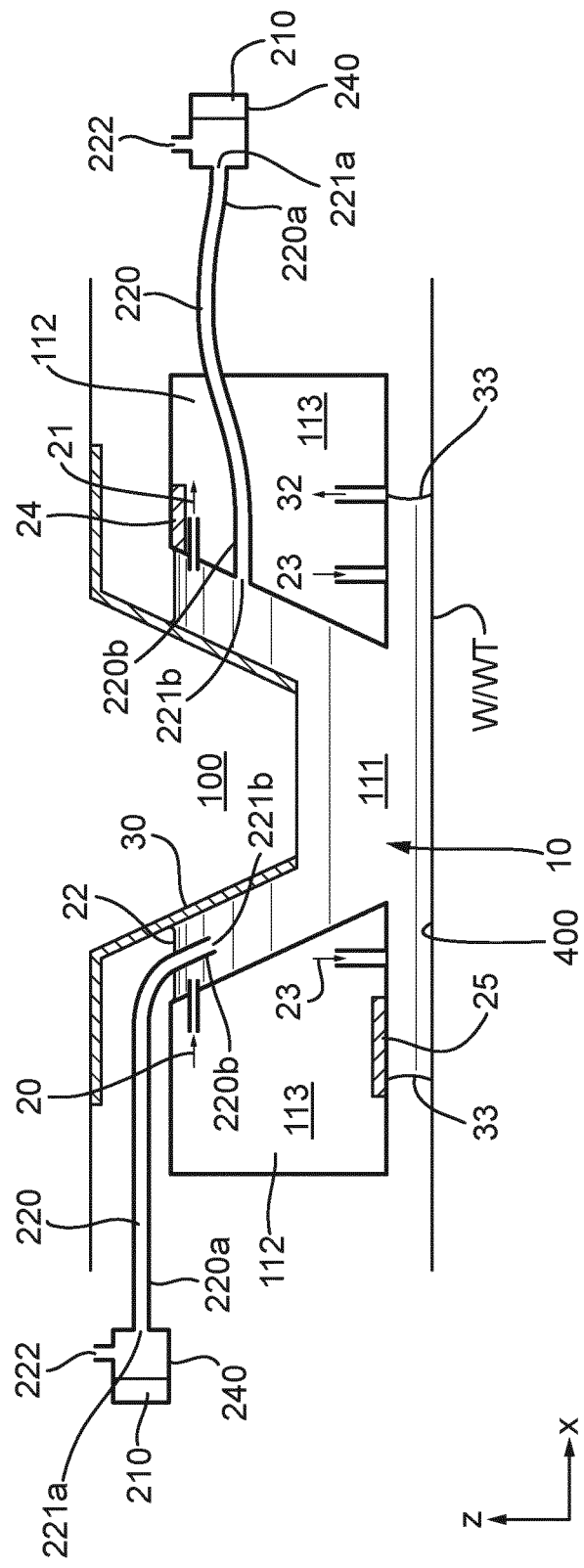

FLUID HANDLING SYSTEM, METHOD AND LITHOGRAPHIC APPARATUS

CROSS-REFERENCE TO RELATED APPLICATIONS

This application is the U.S. national phase entry of POT Patent Application No, PCT/EP2020/078599 which was filed on Oct. 12, 2020, which claims the benefit off priority of European Patent Application No. 19209814.3 which was filed on Nov. 18, 2019 and which is incorporated herein in its entirety by reference.

FIELD

The present invention relates to a fluid handling system and a device manufacturing method. The present invention also relates to the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Further improvements in the resolution of smaller features may be achieved by providing an immersion fluid having a relatively high refractive index, such as water, on the substrate during exposure. The effect of the immersion fluid is to enable imaging of smaller features since the exposure radiation will have a shorter wavelength in the fluid than in gas. The effect of the immersion fluid may also be regarded as increasing the effective numerical aperture (NA) of the system and also increasing the depth of focus.

The immersion fluid may be confined to a localized area between the projection system of the lithographic apparatus and the substrate by a fluid handling structure. The use of such immersion fluid can lead to the presence of droplets on the surface of the substrate. Such droplets can be an issue because when a droplet hits a meniscus of immersion liquid, this can lead to formation of a bubble due to entrapped gas in the immersion liquid. A bubble in the immersion liquid can lead to printed defects on the substrate. The likelihood of such bubbles being introduced can be reduced by reducing the relative speed of the substrate, however, this limits the throughput of the lithographic apparatus.

SUMMARY

It is an object of the present invention to provide a fluid handling system and method in which measures are taken to increase throughput and/or reduce defects on a substrate.

According to the present invention, there is provided a fluid handling system comprising: a liquid confinement structure configured to confine immersion liquid to a space between at least a part of the liquid confinement structure and a surface of a substrate, the liquid confinement structure having an aperture formed therein for the passage therethrough of a radiation beam to irradiate the surface of the substrate by passing through the immersion liquid; and a mechanism configured to vibrate a vibration component in contact with the immersion liquid in use at a frequency of greater than or equal to approximately 30 Hz and less than 9,500 Hz.

According to the present invention, there is also provided a device manufacturing method as herein disclosed.

According to the present invention, there is also provided a lithographic apparatus as herein disclosed.

Further embodiments, features and advantages of the present invention, as well as the structure and operation of the various embodiments, features and advantages of the present invention, are described in detail below with reference to the accompanying drawings.

DESCRIPTION OF THE DRAWINGS

Embodiments of the invention will now be described, by way of example only, with reference to the accompanying schematic drawings, in which corresponding reference symbols indicate corresponding parts, and in which:

FIGS. 2a, 2b and 2c each depict, in cross section, two different versions of a fluid handling system with different features illustrated on the left hand side and the right hand side of each version, which may extend around the complete circumference;

FIGS. 3a, 3b, 3c and 3d each depict, in cross section, variations of a system of a first embodiment of the present invention with two different versions of a fluid handling system with different features illustrated on the left hand side and the right hand side, which may extend around the complete circumference;

FIG. 4 depicts, in cross section, variations of a system of the first embodiment of the present invention with two different versions of a fluid handling system with different features illustrated on the left hand side and the right hand side, which may extend around the complete circumference;

FIG. 6 depicts, in cross section, a system of a second embodiment of the present invention with two different versions of a fluid handling system with different features illustrated on the left hand side and the right hand side, which may extend around the complete circumference.

The features shown in the figures are not necessarily to scale, and the size and/or arrangement depicted is not limiting. It will be understood that the figures include optional features which may not be essential to the invention. Furthermore, not all of the features of the apparatus are depicted in each of the figures, and the figures may only show some of the components relevant for describing a particular feature.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
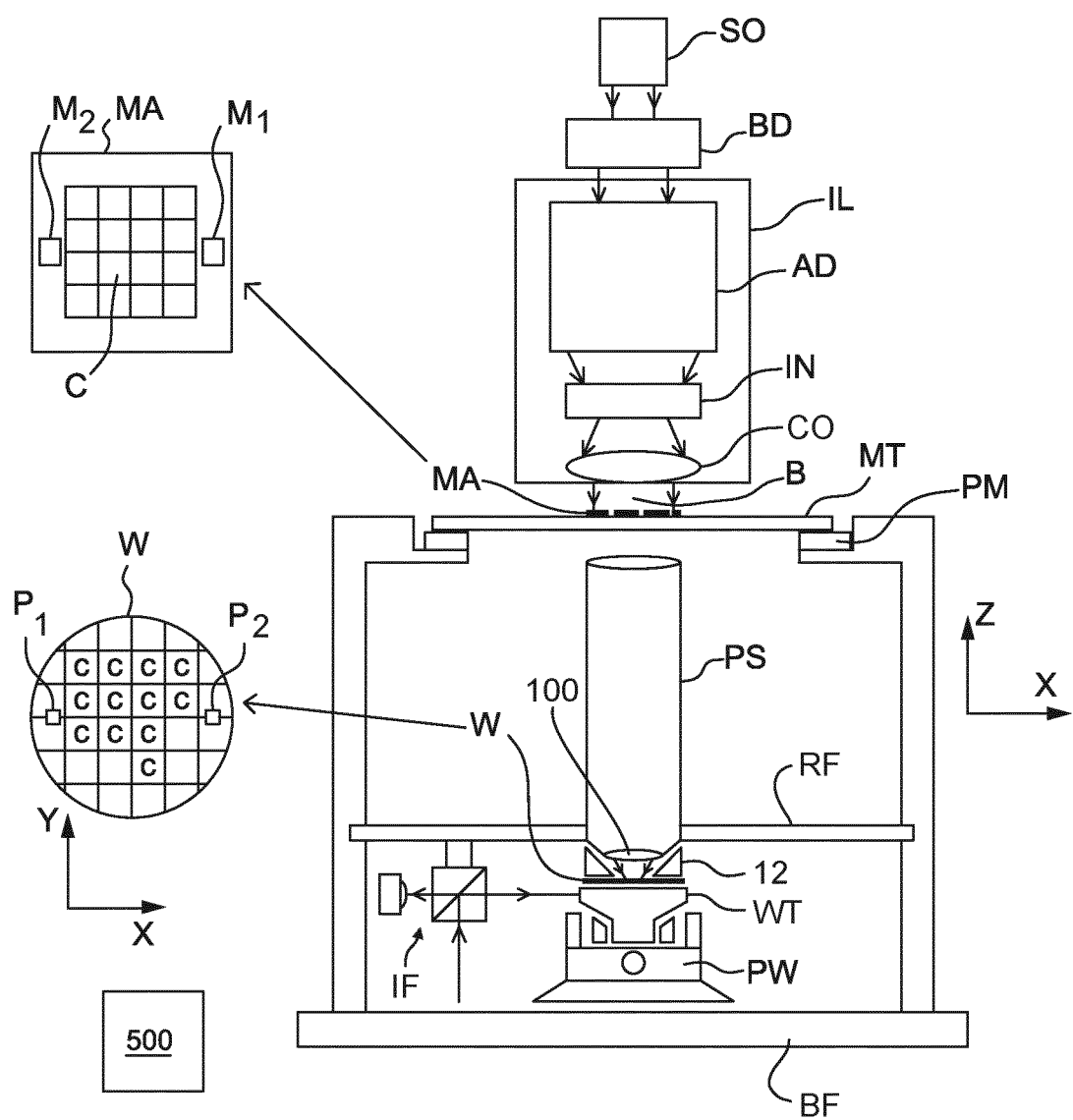
FIG. 1 depicts the schematic overview of the lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 11 between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in figures). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in the immersion space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid.

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the immersion space 11 between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The immersion space 11 filled by the immersion liquid is smaller in plan than the top surface of the substrate W and the immersion space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element 100. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the immersion space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the immersion space 11 and which operate depending on the relative motion of the stage beneath the projection system PS. In more recent designs, the fluid handling structure extends along at least a part of a boundary of the immersion space 11 between the final element 100 of the projection system PS and the substrate support WT or substrate W, so as to in part define the immersion space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system, fluid removal system, liquid confinement structure, etc.

As a barrier member, the fluid handling structure 12 is a barrier to the flow of the immersion liquid from the immersion space 11. As a liquid confinement structure, the structure confines the immersion liquid to the immersion space 11. As a seal member, sealing features of the fluid handling structure 12 form a seal to confine the immersion liquid to the immersion space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element 100 is at least partly surrounded by the fluid handling structure 12. The fluid handling structure 12 may confine the immersion liquid under the final element 100 and above the facing surface.

Figure 2A:
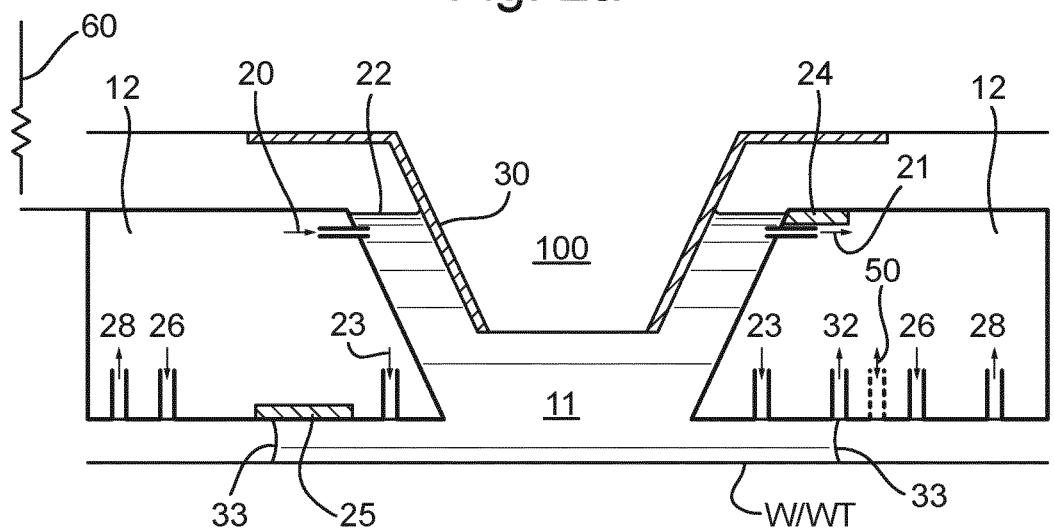
Figure 2B:
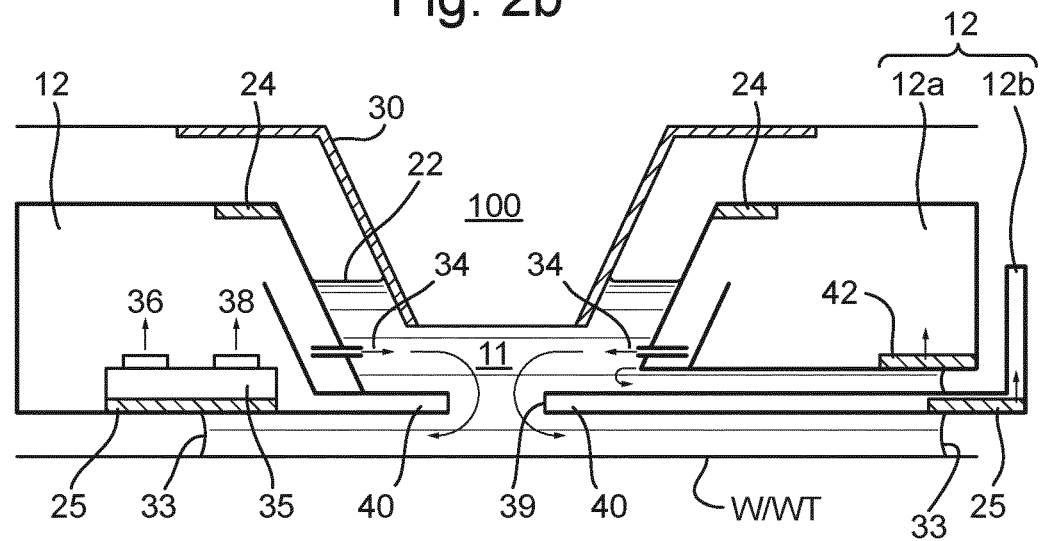

FIGS. 2a, 2b and 2c show different features which may be present in variations of a fluid handling system. The designs may share some of the same features as FIGS. 2a, 2b and 2c unless described differently. The features described herein may be selected individually or in combination as shown or as required. The figures depict different versions of a fluid handling system with different features illustrated on the left hand side and the right hand side, which may extend around the complete circumference. Thus, for example, the fluid handling system may have the same features extending around the complete circumference. For example, the fluid handling system may have only the features of the left hand side of FIG. 2a, or the right hand side of FIG. 2a, or the left hand side of FIG. 2b, or the right hand side of FIG. 2b, or the left hand side of 2c, or the right hand side of 2c. Alternatively, the fluid handling system may be provided with any combination of features from these figures at different locations around the circumference. The fluid handling system may comprise the fluid handling structure 12 as described in the variations below.

FIG. 2a shows a fluid handling structure 12 around the bottom surface of the final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface may have complementary shapes. A top surface of the fluid handling structure 12 may be substantially planar. The fluid handling structure 12 may fit around the frusto-conical shape of the final element 100. A bottom surface of the fluid handling structure 12 may be substantially planar and in use the bottom surface may be parallel with the facing surface of the substrate support WT and/or substrate W. Thus, the bottom surface of the fluid handling structure 12 may be referred to as a surface facing the surface of the substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. The immersion space 11 is therefore defined between the inner surface of the fluid handling structure 12, the planar surface of the frusto-conical portion and the facing surface. During use, the immersion space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the immersion space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the bottom surface of the fluid handling structure 12. The under supply opening 23 may surround the path of the radiation beam B and it may be formed of a series of openings in an array or a single slit. The immersion liquid is supplied to fill the immersion space 11 so that flow through the immersion space 11 under the projection system PS is laminar. The supply of the immersion liquid from the under supply opening 23 additionally prevents the ingress of bubbles into the immersion space 11. This supply of the immersion liquid may function as a liquid seal.

The immersion liquid may be recovered from a recovery opening 21 formed in the inner-surface. The recovery of the immersion liquid through the recovery opening 21 may be by application of an under pressure; the recovery through the recovery opening 21 as a consequence of the velocity of the immersion liquid flow through the immersion space 11; or the recovery may be as a consequence of both. The recovery opening 21 may be located on the opposite side of the supply opening 20, when viewed in plan. Additionally or alternatively, the immersion liquid may be recovered through an overflow recovery 24 located on the top surface of the fluid handling structure 12. The supply opening 20 and recovery opening 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pinning openings 32 through which the immersion liquid is recovered. The pinning openings 32 may recover the immersion liquid in a two phase flow.

Optionally radially outward, with respect to the inner-surface of the fluid handling structure 12, is a gas knife opening 26. Gas may be supplied through the gas knife opening 26 at elevated speed to assist liquid confinement of the immersion liquid in the immersion space 11. The supplied gas may be humidified and it may contain substantially carbon dioxide. Radially outward of the gas knife opening 26 is a gas recovery opening 28 for recovering the gas supplied through the gas knife opening 26.

Further openings, for example open to atmosphere or to a gas source or to a vacuum, may be present in the bottom surface of the fluid handling structure 12, i.e. in the surface of the fluid handling structure 12 facing the substrate W. An example of such an optional further opening 50 is shown in dashed lines on the right hand side of FIG. 2a. As shown, the further opening 50 may be a supply or extraction member, which is indicated by the double-headed arrow. For example, if configured as a supply, the further opening 50 may be connected to a liquid supply or a gas supply as with any of the supply members. Alternatively, if configured as an extraction, the further opening 50 may be used to extract fluid, and may for example, be connected to atmosphere or to a gas source or to a vacuum. For example, the at least one further opening 50 may be present between gas knife opening 26 and gas recovery opening 28, and/or between pinning openings 32 and gas knife opening 26.

The two different versions of the fluid handling structure 12 of the left and right sides of FIG. 2a pin the meniscus 33. The version of the fluid handling structure 12 on the right hand side of FIG. 2a may pin the meniscus 33 at a position that is substantially fixed with respect to the final element 100, due to the fixed position of the pinning opening 32. The version of the fluid handling structure 12 on the left hand side of FIG. 2a may pin the meniscus 33 below the recovery opening 25, and thus the meniscus 33 may move along the length and/or width of the recovery opening 25. For the radiation beam B to be directed to a full side of the substrate W under exposure, the substrate support WT supporting the substrate W is moved relative to the projection system PS. To maximize the output of substrates W exposed by the lithographic apparatus, the substrate support WT (and so substrate W) is moved as fast as possible. However, there is a critical relative speed (often referred to as a critical scan speed) above which the meniscus 33 between the fluid handling structure 12 and the substrate W becomes unstable. An unstable meniscus 33 has a greater risk of losing immersion liquid, for example in the form of one or more droplets.

Furthermore, an unstable meniscus 33 has a greater risk of resulting in the inclusion of gas bubbles in the immersion liquid, especially when the confined immersion liquid crosses the edge of the substrate W.

A droplet present on the surface of the substrate W may apply a thermal load and may be a source of defectivity. The droplet may evaporate leaving a drying stain, it may move transporting contamination such as a particle, it may collide with a larger body of immersion liquid introducing a bubble of gas into the larger body and it may evaporate, applying the thermal heat load to the surface on which it is located. Such a thermal load could be a cause of distortion and/or a source of a positioning error if the surface is associated with positioning of components of the lithographic apparatus relative to the substrate W being imaged. A formation of a droplet on a surface is therefore is undesirable. To avoid formation of such a droplet, the speed of the substrate support WT is thus limited to the critical scan speed at which the meniscus 33 remains stable. This limits the throughput of the lithographic apparatus.

The left hand side of the fluid handling system in FIG. 2a may comprise a spring 60. The spring 60 may be an adjustable passive spring configured to apply a biasing force to the fluid handling structure 12 in the direction of the substrate W. Thus, the spring 60 can be used to control the height of the fluid handling structure 12 above the substrate W. Such adjustable passive springs are described in U.S. Pat. No. 7,199,874 which is herein incorporated by reference in its entirety. Other bias devices may also be appropriate, for example, using an electromagnetic force. Although the spring 60 is shown with the left hand side of FIG. 2a, it is optional and does not need to be included with the other features of the left hand side of FIG. 2a. The spring 60 is not shown on any of the other figures, but could also be included with the other variations of the fluid handling system described in relation to FIGS. 2a, 2b, 2c, 3a, 3b, 3c, 3d, 4, 5a, 5b, 6, and/or 7.

FIG. 2b shows two different versions of the fluid handling structure 12 on its left side and on its right side, which allow movement of the meniscus 33 with respect to the final element 100. The meniscus 33 may move in the direction of the moving substrate W. This decreases the relative speed between the meniscus 33 and the moving substrate W, which may result in improved stability and a reduced risk of breakdown of the meniscus 33. The speed of the substrate W at which the meniscus 33 breaks down is increased so as to allow faster movement of the substrate W under the projection system PS. Throughput is thus increased.

Features shown in FIG. 2b which are common to FIG. 2a share the same reference numbers. The fluid handling structure 12 has an inner surface which complements the conical surface of the frusto-conical shape. The bottom surface of the fluid handling structure 12 is closer to the facing surface than the bottom planar surface of the frusto-conical shape.

Immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the immersion space 11 through recovery openings 25, in the bottom surface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. The immersion liquid may be recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the bottom surface of fluid handling structure 12 extends into the immersion space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

The fluid handling structure 12 may be in two parts as shown on the right hand side of FIG. 2b: an inner part 12a and an outer part 12b. The inner part 12a and the outer part 12b may move relatively to each other, in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12a and the outer part 12b.

The two different versions of the fluid handling structure of FIG. 2b thus allow for movement of the meniscus 33 in the same direction as the substrate W, enabling faster scan speeds and increased throughput of the lithographic apparatus. However, the migration speed of meniscus 33 over the surface of the recovery opening 25 in the fluid handling structure 12 of the left side of FIG. 2b may be slow. The fluid handling structure 12 of the right side of FIG. 2b allows for quicker movement of the meniscus 33, by moving the outer part 12b with respect to the inner part 12a and the final element 100. However, it may be difficult to control the intermediate recovery 42 so as to ensure that enough immersion liquid is provided between the inner part 12a and the outer part 12b to prevent contact therebetween.

FIG. 2c shows two different versions of the fluid handling structure 12 on its left side and on its right side, which may be used to pin the meniscus 33 of the immersion liquid to the fluid handling structure 12 as described above in relation to FIGS. 2a and/or 2b. Features shown in FIG. 2c which are common to FIGS. 2a and/or 2b share the same reference numbers.

The fluid handling structure 12 has an inner surface which compliments the conical surface of the frusto-chronical shape. The bottom surface of the fluid handling structure 12 is closer to the facing surface than the bottom planar surface of the frusto-chronical shape. Immersion liquid is supplied to the immersion space 11 delivered through an opening formed in a surface of the fluid handling structure 12. The immersion liquid may be supplied through a supply opening 34 in the inner surface of the fluid structure 12. Alternatively or additionally, the immersion liquid may be supplied through a supply opening 20 in the inner surface of the fluid structure 12. Alternatively or additionally, the immersion liquid is supplied through the under supply opening 23. The immersion liquid may be recovered via an extraction member, for example, via recovery opening 21 formed in the inner-surface and/or overflow recovery 24 and/or one or more openings in a surface of the fluid handling structure 12 as described below.

The two different versions of the fluid handling structure 12 of the left and right sides of FIG. 2c pin the meniscus 33. The version of the fluid handling structure 12 on the right hand side of FIG. 2c may pin the meniscus 33 at a position that is substantially fixed with respect to the final element 100, due to the fixed position of the recovery opening 32a. The version of the fluid handling structure 12 on the left hand side of FIG. 2c may pin the meniscus 33 below the recovery opening 25, and thus the meniscus 33 may move along the length and/or width of the recovery opening 25.

As described above in relation to FIG. 2b, an inner periphery of the bottom surface of fluid handling structure 12 may extends into the immersion space 11 away from the inner surface to form a plate 40 as shown on the left hand side. As described above, this may form a small aperture, and may isolate the immersion liquid at either side and/or cause immersion liquid to flow inwards towards the aperture, through the inner aperture and then under the plate 40 radially outwardly towards the surrounding the recovery openings 25. Although this features is shown on the left hand side in FIG. 2c, it is optional in combination with the other features shown. Preferably, as shown on the left hand side, immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B. Alternatively or additionally, the immersion liquid may be supplied through a supply opening 20 in the inner surface of the fluid structure 12. Alternatively or additionally, the immersion liquid is supplied through the under supply opening 23. Although the supply openings 34 are the preferred liquid supply, any combination of supply openings 34, supply openings 20 and/or under supply openings 23 may be provided.

As shown on the left hand side of FIG. 2c, a fluid handling system may comprise the fluid handling structure 12 as described above and a further device 300. The fluid handling structure 12 may have an extraction member, such as recovery opening 25, and a liquid supply opening, such as the under supply opening 23. It will be understood that the fluid handling structure 12 may comprise any configuration as disclosed in relation to the left hand of FIG. 2a, the right hand side of FIG. 2a, the left hand side of FIG. 2b, the right hand side of FIG. 2b or (as described below) the right hand side of FIG. 2c, in combination with the further device 300.

The further device 300 may otherwise be referred to as a droplet catcher. The further device 300 is provided to reduce occurrence of liquid on the surface of the substrate W after the fluid handling structure 12 has moved over the surface. The further device 300 may comprise a liquid supply member 301 and at least one extraction member 302. The at least one extraction member 302 may be formed in a shape surrounding the at least one supply member 301 in plan. The at least one liquid supply member 301 may be configured to provide a further liquid to a space 311 between at least a part of the further device 300 and the surface of the substrate W. The further device 300 may be configured to recover at least some of the liquid via the at least one extraction member 302. The further device 300 may be used to incorporate any liquid left on the surface of the substrate W with the liquid in the space 311 and then use the further device 300 to extract the liquid such that the amount of liquid remaining on the surface of the substrate W is reduced.

The further device 300 is shown as a separate device from the fluid handling structure 12 in FIG. 2c. The further device 300 may be positioned adjacent to the fluid handling structure 12. Alternatively, the further device 300 may be part of, i.e. integral to, the fluid handling structure 12 (as in FIG. 3d, however, either arrangement can be selected).

The further device 300 may be configured to provide a liquid to the space 311 which is separate from the liquid provided by the fluid handling structure 12.

Additionally or alternatively, the fluid handling structure 12 may have the components as shown on the right hand side of FIG. 2c. More specifically, the fluid handling structure 12 may comprise the at least one liquid supply member, two extraction members (e.g., recovery openings 32a and 32b) and two gas supply members (e.g., gas supply openings 27a and 27b) formed on the surface of the fluid handling structure 12. The at least one liquid supply member may be the same as the under supply opening 23 in the bottom surface of the fluid handling structure 12 described above or the supply opening 20 or liquid supply openings 34 formed on the inner surface of the fluid handling structure 12 described in relation to left hand side of FIG. 2b. The liquid supply member, the extraction members and the gas supply members may be formed on the surface of the fluid handling structure 12. Specifically, these components may be formed on a surface of the fluid handling structure 12 facing the substrate W, i.e. the bottom surface of the fluid handling structure 12.

At least one of the two extraction members may comprise a porous material 37 therein. The porous material 37 may be provided within an opening, e.g., recovery opening 32a through which fluid handling structure 12 extracts fluid from below the fluid handling structure 12 and may recover the immersion liquid in a single phase flow. The other of the two extraction members, e.g., recovery opening 32b may recover the immersion fluid as a dual phase extractor.

Specifically, the fluid handling structure 12 may comprise the liquid supply member (e.g., under supply opening 23), with a first extraction member (e.g., recovery opening 32a) radially outwards of the liquid supply member, and a first gas supply member (e.g., gas supply opening 27a) radially outwards of the first extraction member, and the second extraction member (e.g., recovery opening 32b) radially outwards of the first gas supply member, and a second gas supply member (e.g., gas supply opening 27b) radially outwards of the second extraction member. Similar to FIG. 2a, further openings, for example open to atmosphere or to a gas source or to a vacuum, may be present in the bottom surface of the fluid handling structure 12 as described previously (in relation to the fluid handling structure 12).

For example, at least one further opening (not shown) may be provided in the bottom surface of the fluid handling structure 12. The further opening is optional. The further opening may be arranged between the first extraction member (e.g., recovery opening 32a) and the first gas supply member (e.g., gas supply opening 27a) as described in the arrangement above. Alternatively or additionally, the further opening may be arranged between the second extraction member (e.g., recovery opening 32b) and the second gas supply member (e.g., gas supply opening 27b) as described in the arrangement above. The further opening may be the same as further opening 50 described above.

Optionally, the fluid handling structure 12 comprises a recess 29. The recess 29 may be provided between the recovery opening 32a and recovery opening 32b or gas supply opening 27a and recovery opening 32b. The shape of the recess 29 may be uniform around the fluid handling structure 12 and may optionally contain an inclined surface. In the case of the recess 29 provided between the recovery opening 32a and recovery opening 32b, the gas supply opening 27b may be provided on the inclined surface as shown in FIG. 2c. In the case of the recess 29 provided between the supply opening 27a and recovery opening 32b, the gas supply opening 27b may be provided on the inclined surface or a part of the bottom surface of the fluid handling structure 12 which is parallel to the surface of the substrate W. Alternatively, the shape of the recess 29 may vary around the circumference of the fluid handling structure 12. The shape of the recess 29 may be varied to alter the impact of gas supplied from the gas supply members on the fluid below the fluid handling structure 12.

FIGS. 2a-2c show examples of different configurations which can be used as part of a fluid handling system. It will be understood that the examples provided above refer to specific extraction members and recovery members, but it is not necessary to use the exact type of extraction member and/or recovery member. In some cases different terminology is used to indicate the position of the member, but the same functional features may be provided. Examples of the extraction member referred to above include recovery opening 21, overflow recover 24, recovery opening 25 (possibly comprising a porous plate and/or the chamber 35), gas recovery opening 28, pinning opening 32, recovery opening 32a, recovery opening 32b and/or the intermediate recovery 42. Examples of the supply member referred to above include supply opening 20, under supply opening 23, gas knife opening 26, gas supply opening 27a, gas supply opening 27b, and/or supply openings 34. In general, an extraction member used to extract/recover fluid, liquid or gas is interchangeable with at least any of the other examples used which extract/recover fluid, liquid or gas respectively. Similarly, a supply member used to supply fluid, liquid or gas is interchangeable with at least any of the other examples used which supply fluid, liquid or gas respectively. The extraction member may extract/recover fluid, liquid or gas from a space by being connected to an under pressure which draws the fluid, liquid or gas into the extraction member. The supply member may supply fluid, liquid or gas to the space by being connected to a relevant supply.

As previously described, although use of immersion fluid is beneficial for improving resolution of smaller features on a substrate, there are also issues with the use of immersion fluid relating to defects being introduced on the substrate.

In general, when immersion liquid is used, droplets of the immersion liquid may be left behind on the surface of the substrate W. The meniscus 33 at the edge of the immersion liquid may collide with any droplets on the surface of the substrate W. When a droplet hits the meniscus 33, gas may be entrapped within the immersion liquid. This results in a bubble in the immersion liquid. Formation of bubbles in the immersion liquid can lead to defects on the substrate W. As described above, the probability of bubble formation can be reduced by reducing the relative speed between the substrate W and the fluid handling structure 12. However, this reduces throughput of the lithographic apparatus.

Experiments have been carried out to observe the formation of such bubbles. It has been observed that droplets which are asymmetrically deformed when they impact the meniscus 33 have less likelihood of forming a bubble. In general, it is thought that this is because the contact between the meniscus 33 and an asymmetrically deformed droplet allows gas to escape rather than becoming entrapped and therefore, no bubble will be formed, or much less volume could be entrapped. Thus, it is determined that it would be beneficial to influence the contact between the droplet and the meniscus 33 during collision.

The present invention should help reduce the effects of at least one bubble related issue. The present invention includes various embodiments which agitate the meniscus to have a non-flat surface to affect the contact between the droplet and the meniscus 33 during collision. The meniscus 33 having a non-flat surface increases the chances that gas can escape when a droplet impacts the meniscus 33. This reduces bubble generation in the immersion liquid and/or allows higher relative speeds between the substrate W and the immersion head without generation of more bubbles. Thus, the defects can be reduced and/or throughput can be increased.

In the present invention, vibration motion is applied to the immersion liquid to excite vibration of the meniscus 33 of the immersion liquid. By adjusting the frequency of vibration, it is possible to tune the interaction between a droplet and the meniscus 33, i.e. to affect whether or not the droplet bounces away from the meniscus or coalesces with it. This principle has been described in academic papers, including at least Molacek, Jan, and John W. M. Bush. "Drops Bouncing on a Vibrating Bath." Journal of the Fluid Mechanics 727 (Jul. 28, 2013): 582-611. © 2013 Cambridge University Press, which is hereby incorporated by reference in its entirety.

The present invention provides a fluid handling system comprising a liquid confinement structure and a mechanism. Variations of the liquid confinement structure 112 and the mechanism 200 are shown throughout FIGS. 3a-7. The liquid confinement structure 112 may be the fluid handling structure 12 as described in any of the embodiments and/or variations above, for example as shown and/or described in relation to the left hand side and/or right hand side of FIGS. 2a and/or 2b and/or 2c. The liquid confinement structure 112 may comprise a body 113 as described in further detail below.

The liquid confinement structure 112 is configured to confine immersion liquid to a space 111 between at least a part of the liquid confinement structure 112 and a surface 400 of the substrate W. The liquid confinement structure 112 can control the immersion liquid by supplying liquid to, and removing liquid from, the space 111. Thus, the immersion liquid can be confined to the space 111. The immersion liquid may be provided by at least one liquid supply member of the liquid confinement structure 112. The at least one liquid supply member may be any appropriate supply member capable of supplying liquid, for example under supply opening 23. The immersion liquid may be removed by at least one liquid extraction member of the liquid confinement structure 112. The at least one extraction member may be any appropriate extraction member capable of extracting liquid, for example pinning opening 32.

The liquid confinement structure 112 has an aperture 10 formed therein for the passage therethrough of a radiation beam B to irradiate the surface 400 of the substrate W by passing through the immersion liquid. In other words, the substrate W can be irradiated by radiation beam B which travels through the immersion liquid and the aperture 10 of the liquid confinement structure 112. The space 111 may be between the liquid confinement structure 112 and the surface 400 of the substrate W. Thus, the space 111 may be the same as the immersion space 11 described above. As described, the space 111 may be between the final element 100 and a surface 400 of the substrate W facing the final element 100. The facing surface is a surface 400 of the substrate W or a surface of the supporting stage (or substrate support WT)

that is co-planar with the surface of the substrate W. (Reference in the following text to the surface 400 of the substrate W also refers in addition, or in the alternative, to the surface of the substrate support WT, unless expressly stated otherwise, and vice versa.) The space 111 may be defined by the liquid confinement structure 112 and the substrate W. Thus, as in the above embodiments and variations, the space 111 may be formed by the liquid confinement structure 112 and the substrate W. The space 111 may be further defined by the final element 100 of the projection system PS. The space 111 may be filled with immersion liquid by the liquid confinement structure 112.

The mechanism 200 is part of the fluid handling system. The mechanism 200 is configured to vibrate a vibration component 210. The vibration component 210 is a physical object which is vibrated by the mechanism 200. The vibration component 210 may be part of the fluid handling system, i.e. the fluid handling system may comprise the vibration component 210. The vibration component 210 is in contact with the immersion liquid in use. In other words, when the immersion liquid is in the space 111 as it would be in use, the immersion liquid will physically touch the vibration component 210. For example, the vibration component 210 may be submersed in the immersion liquid and/or may form an edge of a part of the fluid handling system being used to confine the immersion liquid. The vibration component 210 may be positioned at a meniscus 33 of the immersion liquid, as long as at least part of the vibration component 210 contacts the immersion liquid to induce vibrations in the immersion liquid.

The vibration component 210 may be made of any appropriate material. For example, the vibration component 210 may be formed of the same material as the body 113 of the liquid confinement structure 112. Other materials suitable for the body 113 may be used instead, i.e. the vibration component 210 may be formed of a different material to the body 113. For example only, the vibration component 210 may be formed of metal, e.g. stainless steel.

As described above, the frequency of vibration may be selected to adapt the shape of the meniscus 33, which would thus affect the interaction between the meniscus 33 and a droplet during collision. Vibration of the meniscus 33 induces the formation of waves which are characterised by a dispersion relation between wavelength and frequency of vibration (which may otherwise be referred to as oscillation frequency). Thus, the frequency of vibration affects the wavelength of waves formed along the meniscus 33. As the mechanism 200 is configured to vibrate the vibration component 210, the frequency of vibration of the vibration component 210 is greater than zero. The mechanism 200 is configured to vibrate the vibration component 210 at a frequency of greater than or equal to approximately 30 Hz. The mechanism 200 is configured to vibrate the vibration component 210 at a frequency of less than 9,500 Hz.

Preferably, the frequency is greater than or equal to approximately 30 Hz, as described above. The frequency may be greater than or equal to approximately 40, 50, 60, 70, 80, 90, 100, 200, 300, 400, or 500 Hz. Preferably, the frequency is less than approximately 9,500 Hz. The frequency may be less than or equal to approximately 9,000, 8,000, 7,000, 6,000, 5,000, 4,000, 3,000, 2,000, 1,500, 1,400, 1,300, 1,200, 1,100, 1,000, 900, 800, 700, 600, 500, 400, 300, 200, or 100 Hz.

Preferably, the range of frequencies is greater than or equal to approximately 60 Hz to less than approximately 9,500 Hz, or preferably, the range of frequencies is greater than or equal to approximately 100 Hz and less than or equal to approximately 2,000 Hz, or more preferably, the range of frequencies is greater than or equal to approximately 500 Hz and less than or equal to approximately 1,500 Hz.

The vibration component 210 could be moved in any direction by the mechanism 200 as desirable. Preferably, the vibration component 210 is moved by the mechanism 200 in a substantially horizontal plane. The substantially horizontal plane corresponds to the XY plane as shown in the figures. The vibration component 210 may be translated in at least one linear direction in the XY plane, and/or the vibration component may be rotated about the RZ axis. Vibrating the vibration component 210 in this way may be beneficial to vibration in other directions, because it may reduce disturbance to other components.

As described, the mechanism 200 is used to vibrate the vibration mechanism 210. The mechanism 200 may comprise any appropriate actuator, e.g. a piezoelectric actuator, a Lorentz actuator, a magnetostrictive actuator, or a reluctance actuator. The mechanism 200 may be any appropriate actuator now known or later developed for this purpose.

In a first embodiment, at least a part of the liquid confinement structure 112 is vibrated by the mechanism 200. For example, the liquid confinement structure 112 may comprise body 113 and the vibration component 210, as depicted in FIGS. 3a, 3b, 3c and 3d. FIGS. 3a, 3b, 3c, and 3d are intended to show the vibration mechanism in combination with the liquid handling structure 112 which may have any or all of the features described above in relation to the fluid handling structure 12 in FIGS. 2a, 2b and/or 2c.

The mechanism 200 may be configured to vibrate the vibration component 210 relative to the body 113. The vibration component 210 may form a barrier at the edge of the immersion liquid to define the space 111. Thus, the vibration component 210 may form an edge contact of the liquid confinement structure 112 with the immersion liquid. It may be preferable to provide the vibration component 210 as a separate element from the body 113 because actuating less mass is likely to reduce disturbance forces in the fluid handling system and apparatus as a whole. The vibration component 210 may be positioned within, or adjacent to the body 213. The vibration component 210 may be positioned within a recess of the body 113, as shown in FIGS. 3a, 3b, 3c and 3d. The vibration component 210 may be of any appropriate shape.

The vibration component 210 may be coupled to the body 213 via at least the mechanism 200, i.e. the vibration component 210 and the body 113 may be connected via at least the mechanism 200. FIGS. 3a, 3b, 3c and 3d show the mechanism 200 connected to a top part of the vibration component 210, however, the mechanism 200 may be attached to the vibration component 210 at any appropriate location. The vibration component 210 and the body 113 may additionally be coupled by some form of retaining means, e.g. via at least one spring 214 attached to the vibration component 210 and the body 113. FIGS. 3a, 3b, 3c and 3d show the spring 214 connected to a side part of the vibration component 210, however, the spring 214 may be attached to the vibration component 210 at any appropriate location.

As shown in FIGS. 3a, 3b, 3c and 3d, the vibration component 210 may be positioned radially inwards of any liquid supply members and/or any liquid extraction members. Alternatively, the vibration component 210 may be positioned between any one of the liquid supply members and/or any liquid extraction members.

Figure 3B:
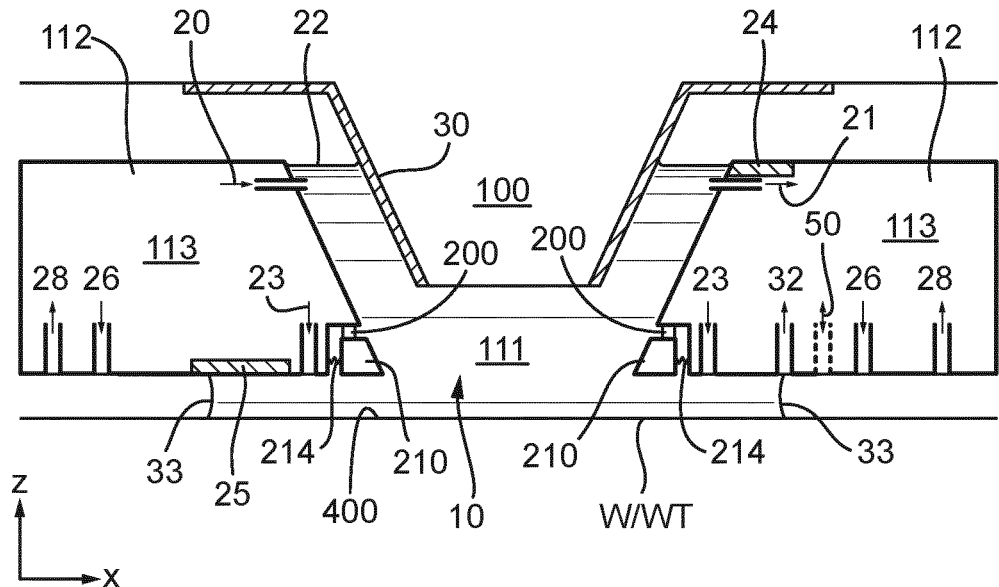

For example, in relation to the left hand side of FIG. 3a, the vibration component 210 could be positioned adjacent to the recovery opening 25, e.g., porous material. The vibration component 210 could be positioned between a liquid supply opening (e.g. the under supply openings 23) and a liquid extraction opening (e.g. recovery opening 25). For example, in relation to the right hand side of FIGS. 3a and 3b, the vibration component 210 could be positioned between a liquid supply opening (e.g. the under supply openings 23) and a liquid extraction opening (e g pinning openings 32). For example, in relation to the left hand side of FIG. 3b, the vibration component 210 could be positioned adjacent to the recovery opening 25, e.g., porous material. The vibration component 210 could be positioned between a liquid supply opening (e.g. the under supply openings 23) and a liquid extraction opening (e.g. recovery opening 25).

Figure 3C:
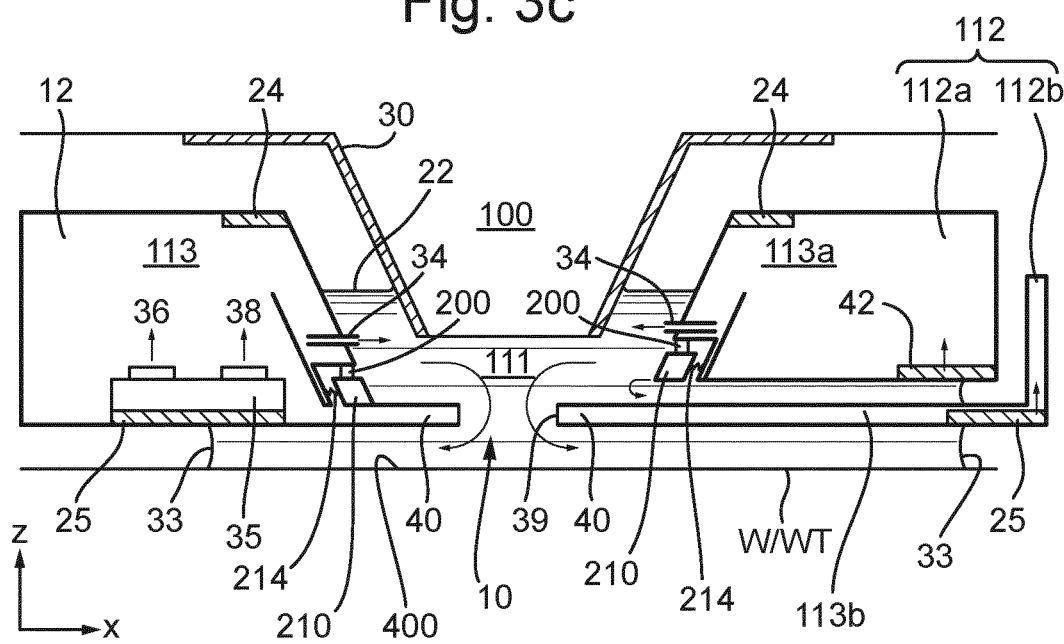

For example, in relation to the left hand side of FIG. 3c, the vibration component 210 could be positioned radially inwards of a liquid extraction opening (e.g. recovery opening 25). In relation to the left hand side of FIG. 3c, the vibration component 210 could be positioned within the chamber 35 (as long as the vibration component 210 can directly contact the immersion liquid). In relation to the left hand side of FIG. 3c, it is noted that the vibration mechanism 210 could form part of, or replace part of, the plate 40. For example, in relation to the right hand side of FIG. 3c, the vibration component 210 could be positioned radially inwards of a liquid extraction opening (e.g. intermediate recovery 42). In relation to the right hand side of FIG. 3c, it is noted that liquid confinement structure 112 may have an inner part 112a (corresponding to the inner part 12a of FIG. 2b described above), and an outer part 112b (corresponding to the outer part 12b of FIG. 2b described above). Thus, the body 113 may be formed of a first body element 113a forming the inner part 112a, and a second body element 113b forming the outer part 112b. Optionally, the first body element 113a and the second body element 113b are coupled to each other. Preferably, the coupling allows the movement of the first body element 113a relative to the second body element 113b, e.g. via an elastic connection. The vibration mechanism 210 may form at least a part of the inner part 112a, as shown in the right hand side of FIG. 3c. Additionally or alternatively, the vibration mechanism 210 may form at least a part of the outer part 112b. For example, in relation to the right hand side of FIG. 3c, the vibration mechanism 210 could form part of, or replace part of, the plate 40. In this case, the vibration component 210 may be positioned radially inwards of a liquid extraction opening (e.g. recovery opening 25).

For example, in relation to the left hand side of FIG. 3d, the vibration component 210 could be positioned adjacent to the recovery opening 25, e.g., porous material. The vibration component 210 could be positioned between a liquid supply opening (e.g. the under supply openings 23) and a liquid extraction opening (e.g. recovery opening 25). For example, in relation to the right hand side of FIG. 3d, the vibration component 210 could be positioned between a liquid supply opening (e.g. the under supply openings 23) and a liquid extraction opening (e.g. recovery opening 32a).

There may be a single, (i.e. only one) vibration component 210 as shown in FIGS. 3a, 3b, 3c and 3d. Alternatively, there may be multiple vibration components 210. These might be located at different positions of the liquid confinement structure 112, for example, at any or all of the locations described above in relation to FIGS. 3a, 3b, 3c and 3d.

In this embodiment, the body 113 of the liquid confinement structure 112 may be vibrated, i.e. the liquid confinement structure 112 may be moved as a whole, as shown in FIG. 4. In this case, the body 113 is the vibration component. In this case, substantially the whole liquid confinement structure 112 may be moved by the mechanism 200. It might be relatively simple to implement vibration of the liquid confinement structure 112 as a whole. However, vibrating the body 113 of the liquid confinement structure 112 may be more likely to introduce disturbance forces to the substrate W and/or components of the lithographic apparatus e.g. the substrate support WT.

In FIG. 4, the mechanism 200 is attached to the top of the liquid confinement structure 112, however, the mechanism 200 can be attached to any appropriate part of the liquid confinement structure 112. In this instance, the mechanism 200 may advantageously be positioned outside of the immersion liquid. The mechanism 200 may be attached to a non-moving part of the lithographic apparatus, such as a support frame (not shown). Retaining means (not shown) may also be provided between the body 113 of the liquid confinement structure 112 and the non-moving part of the lithographic apparatus, as described above in relation to FIGS. 3a, 3b, 3c and 3d.

It will be understood that FIG. 4 depicts the variation in which the whole of the body 113 of the liquid confinement structure 112 is vibrated. Although FIG. 4 depicts features of the liquid confinement structure 112 corresponding to FIG. 3a, the liquid confinement structure 112 may have the features as shown in any of FIG. 3b, 3c, or 3d, i.e. the liquid confinement structure 112 could have any of the features of the fluid handling structure 12 of FIGS. 2a, 2b and/or 2c.

In the first embodiment, the body 113 of the liquid confinement structure 112 may be formed by multiple segments, e.g. a first body element 113a and a second body element 113b. Optionally, the first body element 113a and the second body element 113b are coupled to each other. Preferably, the coupling allows the movement of the first body element 113a relative to the second body element 113b, e.g. via an elastic connection.

Figure 5A:
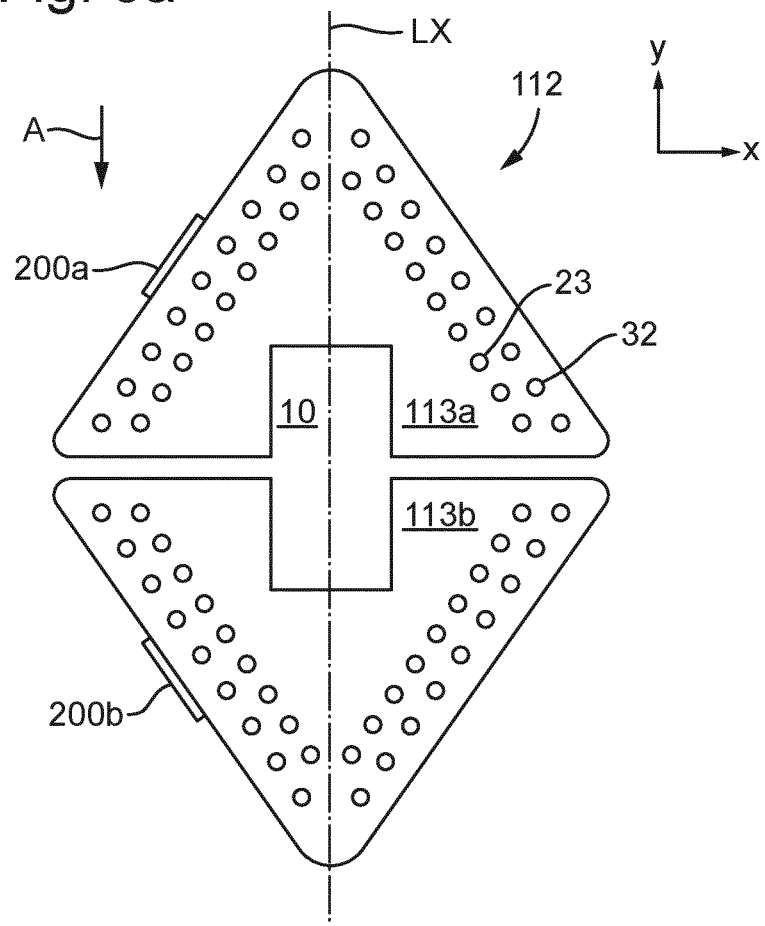
FIGS. 5a and 5b depict, variations of a system of the first embodiment.
Figure 5B:
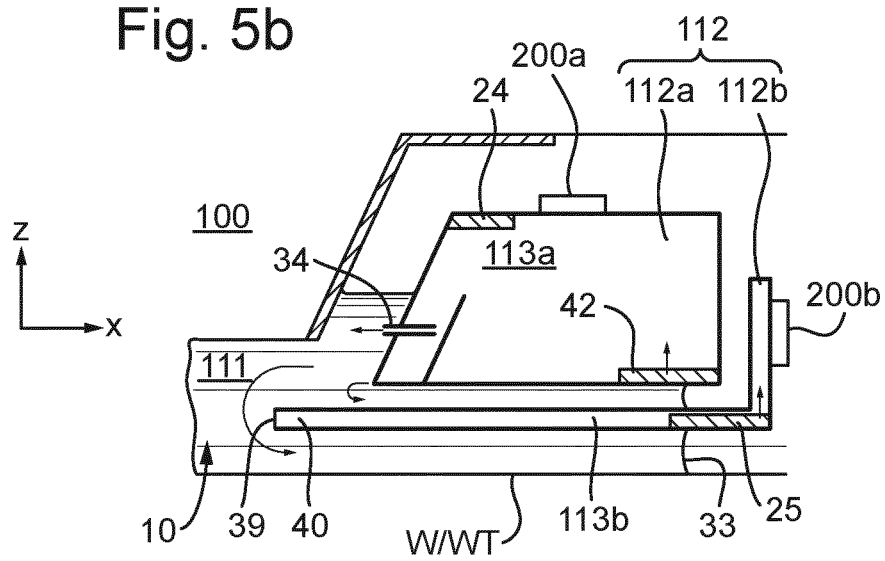

Such variations are shown in FIGS. 5a and 5b. In this instance, the first body element 113a and the second body element 113b may each be a vibration component. The mechanism may comprise a first mechanism 200a and a second mechanism 200b. In this case, the first mechanism 200a may be configured to vibrate the first body element 113a (acting as a first vibration component) and the second mechanism 200b may be configured to vibrate the second body element 113b (acting as a second vibration component). The first mechanism 200a and the second mechanism 200b may be configured to vibrate the first body element 113a and/or the second body element 113b respectively at the frequencies as described above.

Providing the liquid confinement structure 112 in multiple segments is advantageous because it allows more control over the vibration of the body 113, for example, the first body element 113a and the second body element 113b can be vibrated at different frequencies at the same time.

For example only, the liquid confinement structure 112 may have a longitudinal axis LX. In plan, the body 113 may be is separated into the first body element 113a and the second body element 113b along the longitudinal axis LX. Thus, a separation between the first body element 113a and the second body element 113b may transverse the longitudinal axis LX. The first body element 113a may form a front part of the liquid confinement structure 112, and the second body element 113b may form a back part of the liquid confinement structure 112. This is shown in FIG. 5a, which is a view of the underside of the liquid confinement structure 112. As shown in FIG. 5a, the substrate W may be moved relative to the liquid confinement structure 112 in a direction substantially parallel to the longitudinal axis LX of the liquid confinement structure 112. Thus, the first body element 113a in FIG. 5a may be a front part of the liquid confinement structure 112 and the second body element 113b may be a back part of the liquid confinement structure 112. Of course, the body 113 may be formed by the first body element 113a and the second body element 113b using a variety of shapes, for example, the separation between the first body element 113a and the second body element 113b may be formed along, or substantially parallel to, the longitudinal axis LX.

The vibration of the first body element 113a and the second body element 113b may be controlled to produce better coherence of a droplet at the meniscus 33 at the front of the liquid confinement structure 112 compared to the back of the liquid confinement structure 112. This may be beneficial because it may reduce introduction of bubbles at the front of the liquid confinement structure 112 which may have a greater likelihood of causing defects on the substrate W.

In FIG. 5a, the first mechanism 200a and the second mechanism 200b are shown on a side of the first body element 113a and the second body element 113b respectively, however, the first mechanism 200a and the second mechanism 200b may be positioned at any appropriate location. The shape of the liquid confinement structure 112, the formation and shape of the under supply opening 23, and the formation and shape of the pinning openings 32 as shown in FIG. 5a are for example only and any shape/formation can be used. Any additional or alternative liquid supply openings and/or liquid extraction openings may be provided.

As shown in FIG. 5b, the first body element 113a may be an inner part 112a as described above, and the second body element 113b may be an outer part 112b as described above. In FIG. 5b, only the right hand side of the fluid handling system is depicted.

The first mechanism 200a and the second mechanism 200b may be provided on any appropriate surface of the first body element 113a and the second body element 113b respectively. In this instance, the first mechanism 200a and the second mechanism 200b may be positioned outside of the immersion liquid. The first mechanism 200a and the second mechanism 200b may be attached to a non-moving part of the lithographic apparatus, such as a support frame (not shown). The first mechanism 200a and the second mechanism 200b may be attached to the same non-moving part. Retaining means (not shown) may also be provided between the first body element 113a and/or the second body element 113b and the non-moving part of the lithographic apparatus, as described above in relation to FIGS. 3a, 3b, 3c and 3d.

It will be understood that FIGS. 5a and 5b depict variations in which separate parts of the body 113 of the liquid confinement structure 112 are vibrated. Only one of the parts of the body 113 may be vibrated. At least one part of the body 113 may be held stationary whilst at least one other part of the body 113 vibrates. Although FIGS. 5a and 5b depict features of the liquid confinement structure 112 corresponding to FIG. 3a, the liquid confinement structure 112 may have the features as shown in any of FIG. 3b, 3c, or 3d, i.e. the liquid confinement structure 112 could have any of the features of the fluid handling structure 12 of FIGS. 2a, 2b and/or 2c.

In a second embodiment, the vibration component 210 is positioned external to the liquid confinement structure 112. Variations of the second embodiment are shown on the left hand side and right hand side of FIG. 6. The vibration component 210 may be in contact with the immersion fluid via a liquid connection. In this embodiment, the fluid handling system further comprises a passage 220 connected to the vibration component 210 such that the vibration component 210 is in contact with the immersion liquid via the passage 220. The passage 220 may be filled with the immersion liquid in use. In other words, vibration component 210 contacts the immersion liquid which passes through the passage 220 to the space 111.

The passage 220 may comprise a first opening 221a at a first end 220a and a second opening 221b at a second end 220b. The passage 220 may be coupled with the vibration component 210 at a first end 220a. Depending on the respective shapes of the first end 220a and the vibration component 210, the first end 220a may be coupled to the vibration component 210 with housing 240. However, this may not be used if the vibration component 210 is fitted directly onto the first end 220a. The passage 220 may be in contact with the immersion liquid at a second end 220b. For example, the second opening 221b may be positioned such that it is submerged in the immersion liquid in use, as shown on the left hand side of FIG. 6. The passage 220 may be connected to, or form part of, the liquid confinement structure 112 if desirable. Thus, for example, the passage 220 may be at least partially formed as part of the liquid confinement structure 112. In this case, the second opening 221b may be formed on an edge of the liquid confinement structure 112 in contact with the immersion liquid in use, as shown on the right hand side of FIG. 6.

As shown in FIG. 6, the housing 240 may comprise a further opening 222 which can be used remove gas from the passage 220 to ensure that it is filled with immersion liquid. Preferably, the further opening 222 is positioned adjacent to the vibration component 210 to remove any gas and maintain contact between the immersion liquid and the vibration component 210. The further opening 222 may additionally or alternatively be positioned on the passage 220.

As the immersion liquid is incompressible, the location of the vibration source can be outside of the liquid confinement structure 112 whilst still providing the above described vibration to the immersion liquid. Providing the vibration component 210 external to the liquid confinement structure 112 as in the second embodiment is beneficial because it provides more design freedom as it is not necessary to provide the mechanism 200 and/or vibration component 210 within, as part of, or attached to the liquid confinement structure 112. This may provide additional options for the mechanism 200 because there will be fewer size restrictions.

It will be understood that FIG. 6 depicts variations of the second embodiment in which the vibration component 210 is positioned external to the liquid confinement structure 112. Although FIG. 6 depicts features of the liquid confinement structure 112 corresponding to FIG. 3a, the vibration component 210 as described in relation to the left hand side or the right hand side of FIG. 6 may be provided with a liquid confinement structure having the features as shown in any of FIG. 3a, 3b, 3c, or 3d, i.e. the liquid confinement structure 112 could have any of the features of the fluid handling structure 12 of FIGS. 2a, 2b and/or 2c.

In a third embodiment, the vibration component 210 comprises a membrane 230. The membrane 230 may be formed of any appropriate material. For example, the membrane 230 may be a metal, e.g. stainless steel or nickel. The membrane 230 may be formed on a surface of the liquid confinement structure 112, the surface being in contact with the immersion liquid in use. Preferably, the surface of the liquid confinement structure 112 comprising the membrane 230 is the surface that faces the substrate W, which may otherwise be referred to as the bottom surface of the liquid confinement structure 112. However, the membrane 230 is not necessary positioned on this surface. The membrane 230 could be provided on any other appropriate surface of the liquid confinement structure 112. The membrane 230 is advantageous because it can keep immersion liquid away from the mechanism 200 i.e. the membrane 230 can act as a liquid separation feature. The membrane 230 may be advantageous in providing a larger surface area in contact with the immersion liquid than when using the vibration mechanism 210 without a membrane 230.

Figure 7:
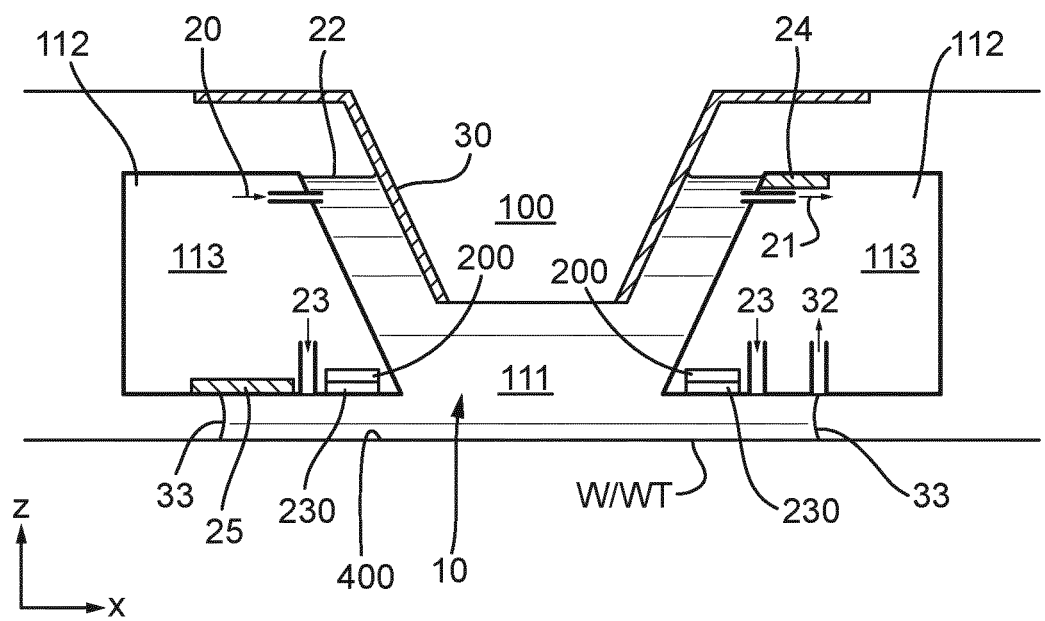
FIG. 7 depicts, in cross section, a system of a third embodiment of the present invention with two different versions of a fluid handling system with different features illustrated on the left hand side and the right hand side, which may extend around the complete circumference.

In this instance the membrane 230 and the mechanism 200 may be positioned within a recess of the body 113 of the liquid confinement structure 112, as depicted in FIG. 7.

The membrane 230 may be positioned on the liquid confinement structure 112 in any appropriate location, as described in relation to the vibration component 210 of the first embodiment. For example, FIG. 7 shows the membrane 230 being positioned radially inwards of any liquid supply members and liquid extraction members, and the membrane 230 could be provided between any of the liquid supply members and/or liquid extraction members.

It will be understood that FIG. 7 depicts variations of the third embodiment in which the vibration component 210 is the membrane 230. Although FIG. 7 depicts features of the liquid confinement structure 112 corresponding to FIG. 3a, the membrane 230 may be provided with a liquid confinement structure 112 having the features as shown in any of FIG. 3a, 3b, 3c, or 3d, i.e. the liquid confinement structure could have any of the features of the fluid handling structure 12 of FIGS. 2a, 2b and/or 2c.

The membrane 230 may be replaced with a bellow, preferably a metal bellow. In this instance, the vibration component 210 may be in contact with the bellow to make the bellow move. The bellow may be in contact with the immersion liquid to thus provide vibration to the immersion liquid. This may provide similar advantages to the use of the membrane 230 and may further increase the contact area with the immersion liquid. Particularly, the bellow may separate the mechanism 200 from the immersion liquid. For example only, the bellow may be the same or similar to those produced by Servometer®. For example only, the bellow may have a wall thickness of approximately 10 μm.

It will also be understood that the first, second and third embodiments all relate to different variations of vibration component 210 used to vibrate the immersion liquid. It may be the case that some or all of these embodiments are combined, for example, to vibrate at least part of the body 113 of the liquid confinement structure 112 as well as a membrane 230. In other words, the variations described in the first, second and/or third embodiments could be combined, e.g. by providing multiple vibration components and/or mechanisms with any one of the fluid handling structures 12 described in relation to FIGS. 2a, 2b and/or 2c, or any one of the liquid confinement structures 112 described in relation to FIGS. 3a, 3b, 3c and/or 3d.

The present invention may provide a lithographic apparatus. The lithographic apparatus may have any/all of the other features or components of the lithographic apparatus as described above. For example, the lithographic apparatus may optionally comprise at least one or more of a source SO, an illumination system IL, a projection system PS, a substrate table WT, etc.

Specifically, the lithographic apparatus may comprise the projection system PS configured to project the radiation beam B towards the region of the surface of a substrate W. The lithographic apparatus may further comprise the fluid handling system as described in any of the above embodiments and variations.

The lithographic apparatus may comprise an actuator configured to move the substrate W relative to the fluid handling system. Thus, the actuator may be used to control the position of the substrate W (or alternatively, the position of the fluid handling system). The actuator could be, or could comprise, the substrate support (e.g., a substrate table) WT constructed to hold the substrate W and/or the second positioner PW configured to accurately position the substrate support WT.

Embodiments are provided according to the following clauses:

1. A fluid handling system comprising:
    a liquid confinement structure configured to confine immersion liquid to a space between at least a part of the liquid confinement structure and a surface of a substrate, the liquid confinement structure having an aperture formed therein for the passage therethrough of a radiation beam to irradiate the surface of the substrate by passing through the immersion liquid; and
    a mechanism configured to vibrate a vibration component in contact with the immersion liquid in use at a frequency of greater than or equal to approximately 30 Hz and less than 9,500 Hz.
2. The fluid handling system of clause 1, wherein the liquid confinement structure comprises a body, and the vibration component is the body of the liquid confinement structure such that the mechanism is configured to vibrate the body, or wherein the liquid confinement structure comprises a body and the mechanism is configured to vibrate the vibration component relative to the body of the liquid confinement structure, or wherein the mechanism comprises a first mechanism and a second mechanism, the liquid confinement structure comprises a body formed of a first body element and a second body element, and the first mechanism is configured to vibrate the first body element and the second mechanism is configured to vibrate the second body element.
3. The fluid handling system of clause 2, wherein the vibration component and the body are coupled to each other, or wherein the liquid confinement structure has a longitudinal axis, and in plan, the body is separated into the first body element and the second body element along the longitudinal axis, or wherein the liquid confinement structure has a longitudinal axis, and in plan, the body is separated into the first body element and the second body element along the longitudinal axis, or wherein the first body element forms an inner part of the liquid confinement structure and the second body element forms the outer part of the liquid confinement structure.
4. The fluid handling system of clause 3, wherein the first body element forms an inner part of the liquid confinement structure and the second body element forms the outer part of the liquid confinement structure and/or wherein the first body element and the second body element are coupled to each other.
5. The fluid handling system of clause 1, wherein the vibration component is positioned external to the liquid confinement structure, and the fluid handling system further comprises a passage connected to the vibration component such that the vibration component is in contact with the immersion liquid via the passage filled with the immersion liquid in use, or wherein the vibration component comprises a membrane formed on a surface of the liquid confinement structure in contact with the immersion liquid in use.

6. The fluid handling system of clause 5, wherein the surface faces the substrate and the membrane is positioned on the surface.

7. The fluid handling system of any of clauses 1-6, wherein the frequency is greater than or equal to approximately 60 Hz, or preferably the frequency is approximately 100 Hz to 2,000 Hz, or more preferably approximately 500 Hz to 1,500 Hz, and/or wherein the vibration component is moved by the mechanism in a substantially horizontal plane, and/or wherein the mechanism comprises a piezoelectric actuator, a Lorentz actuator, a magnetostrictive actuator, or a reluctance actuator, and/or wherein the liquid confinement structure comprises at least one liquid supply member configured to provide immersion liquid to the space and at least one extraction member configured to remove the immersion liquid from the space.

8. The fluid handling system of clause 7, wherein the at least one liquid supply member comprises a liquid supply opening formed on an inner surface of the liquid confinement structure, and/or wherein the at least one liquid supply member comprises a liquid supply opening formed on a surface of the liquid confinement structure facing the surface of the substrate, and/or wherein the liquid confinement structure comprises two extraction members and two gas supply members, wherein the at least one liquid supply member, the two extraction members and the two gas supply members are formed on a surface of the liquid confinement structure facing the surface of the substrate.

9. The fluid handling system of clause 8, wherein a first one of the extraction members is radially outwards of the at least one liquid supply member, a first one of the two gas supply members is radially outwards of the first one of the extraction members, a second one of the extraction members is radially outwards of the first one of the two gas supply members, a second of the two gas supply members is radially outwards of the second one of the two extraction members, and/or wherein at least one of the two extraction members comprises a porous material therein, and/or further comprising at least one further opening in the surface of the liquid confinement structure facing the surface of the substrate, wherein the at least one further opening is arranged between the first one of the two extraction members and the first one of the two gas supply members, and/or between the second one of the two extraction members and the second one of the two gas supply members, and/or wherein the surface of the liquid confinement structure comprises a recess and optionally the recess has an inclined surface, and/or wherein the vibration component is arranged radially inwards of the at least one liquid supply member, and/or between the at least one liquid supply member and the first one of the extraction members.

10. The fluid handling system of any of clauses 1-9, wherein the liquid confinement structure comprises at least two extraction members and at least one gas supply member, wherein the liquid supply member, the at least two extraction members and the gas supply member are formed on a surface of the liquid confinement structure facing the surface of the substrate, or wherein the at least one extraction member of the liquid confinement structure comprises a chamber in a surface of the liquid confinement structure facing the surface of the substrate, and a porous material within the chamber, and the at least one extraction member comprises a first channel configured to extract liquid from the chamber and a second channel configured to extract gas from the chamber, or wherein the liquid confinement structure comprises an inner part and an outer part, wherein the at least one liquid supply member of the liquid confinement structure is formed on the inner part, and wherein the inner part comprises a first extraction member and the outer part comprises a second extraction member, and/or further comprising a further device comprising at least one further liquid supply member and at least one further extraction member, the at least one further liquid supply member being configured to provide a liquid to a further space between at least a part of the further device and the surface of the substrate, wherein the further device is configured to recover at least some of the liquid via the at least one further extraction member.

11. The fluid handling system of clause 10, wherein in plan, a first one of the at least two extraction members is radially outwards of the gas supply member, the gas supply member is radially outwards of a second one of the at least two extraction members, and the second one of the at least one extraction members is radially outwards of the liquid supply member, or wherein the vibration component is positioned within the chamber, or wherein the outer part comprises a plate positioned between the inner part and the substrate, the plate being configured to isolate the first liquid on either side of the plate, and wherein a surface of the inner part facing the plate comprises the first extraction member, and a surface of the plate facing the substrate comprises the second extraction member, or wherein the further device is part of, or positioned adjacent to the liquid confinement structure.

12. The fluid handling system of clause 11, further comprising at least one further opening in the surface of the liquid confinement structure facing the surface of the substrate, wherein the at least one further opening is arranged between the first one of the two extraction members and the gas supply member and/or between the gas supply member and the second one of the two extraction members, and/or wherein the vibration component is arranged between the at least one liquid supply member and the second one of the at least one extraction members, and/or wherein at least one of the at least two extraction members comprises a porous material therein.

13. The fluid handling system of clause 12, wherein the porous material is provided in the extraction member which is most radially inwards, and/or wherein the vibration component is arranged adjacent to the porous material.

14. The fluid handling system of clause 11, wherein the first extraction member and/or the second extraction member comprises a porous material configured to recover the first liquid in a single phase flow, and/or wherein the vibration component forms at least part of the inner part and/or at least part of the outer part.

15. A lithographic apparatus comprising:
a projection system configured to project a radiation beam towards the surface of a substrate; and
the fluid handling system of any of clauses 1 to 14.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented by instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use ambient (non-vacuum) conditions.

Although specific reference may have been made above to the use of embodiments of the invention in the context of optical lithography, it will be appreciated that the invention, where the context allows, is not limited to optical lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A fluid handling system comprising:
   a liquid confinement structure configured to confine immersion liquid to a space between at least a part of the liquid confinement structure and a surface of a substrate to form a meniscus at an interface of the immersion liquid with a gaseous environment outward of the confined immersion liquid, the liquid confinement structure having an aperture formed therein for the passage therethrough of a radiation beam to irradiate the surface of the substrate by passing through the immersion liquid; and
   a mechanism configured to vibrate a vibration component in contact with the immersion liquid, in use, at a frequency of greater than or equal to approximately 30 Hz and less than 9,500 Hz to change a shape of a surface of the meniscus.

2. The fluid handling system of claim 1, wherein the liquid confinement structure comprises a body and the mechanism is configured to vibrate the vibration component relative to the body of the liquid confinement structure.

3. The fluid handling system of claim 2, wherein the vibration component and the body are coupled to each other.

4. The fluid handling system of claim 1, wherein the vibration component is positioned external to the liquid confinement structure, and the fluid handling system further comprises a passage connected to the vibration component such that the vibration component is in contact with the immersion liquid via the passage filled with the immersion liquid in use, or wherein the vibration component comprises a membrane formed on a surface of the liquid confinement structure configured to be in contact with the immersion liquid in use.

5. The fluid handling system of claim 4, wherein the vibration component comprises the membrane and the surface faces the substrate and the membrane is positioned on the surface.

6. The fluid handling system of claim 1, wherein the frequency is greater than or equal to approximately 60 Hz, and/or wherein the vibration component is moved by the mechanism in a substantially horizontal plane, and/or wherein the mechanism comprises a piezoelectric actuator, a Lorentz actuator, a magnetostrictive actuator, or a reluctance actuator, and/or wherein the liquid confinement structure comprises at least one liquid supply member configured to provide immersion liquid to the space and at least one extraction member configured to remove the immersion liquid from the space.

7. The fluid handling system of claim 6, wherein the liquid confinement structure comprises the at least one liquid supply member and the at least one extraction member and wherein:
   the at least one liquid supply member comprises a liquid supply opening formed on an inner surface of the liquid confinement structure and/or the at least one liquid supply member comprises a liquid supply opening formed on a surface of the liquid confinement structure facing the surface of the substrate, and/or
   the liquid confinement structure comprises at least two extraction members and at least two gas supply members, wherein the at least one liquid supply member, at least one of the at least two extraction members and at least one of the at least two gas supply members are formed on a surface of the liquid confinement structure facing the surface of the substrate.

8. The fluid handling system of claim 7, wherein the liquid confinement structure comprises the at least two extraction members and the at least two gas supply members and wherein:
   a first one of the at least two extraction members is radially outwards of the at least one liquid supply member, a first one of the at least two gas supply members is radially outwards of the first one of the at least two extraction members, a second one of the at least two extraction members is radially outwards of the first one of the at least two gas supply members, a second one of the at least two gas supply members is radially outwards of the second one of the at least two extraction members, and/or
   at least one of the at least two extraction members comprises a porous material therein; and/or further comprising at least one further opening in the surface of the liquid confinement structure facing the surface of the substrate, wherein the at least one further opening is arranged between a first one of the at least two extraction members and a first one of the at least two gas supply members, and/or between a second one of the at least two extraction members radially outwards from the first one of the at least two gas supply members and a second one of the at least two gas supply members; and/or wherein the surface of the liquid confinement structure comprises a recess; and/or wherein the vibration component is arranged radially inwards of the at least one liquid supply member, and/or between the at least one liquid supply member and a first one of the extraction members.

9. The fluid handling system of claim 1, wherein the liquid confinement structure comprises at least two extraction members, at least one liquid supply member, and at least one gas supply member, wherein the at least one liquid supply member, the at least two extraction members and the at least one gas supply member are formed on a surface of the liquid confinement structure facing the surface of the substrate.

10. The fluid handling system of claim 9, wherein in plan, a first one of the at least two extraction members is radially outwards of a gas supply member of the at least one gas supply member, the gas supply member is radially outwards of a second one of the at least two extraction members, and the second one of the at least one extraction members is radially outwards of a liquid supply member of the at least one liquid supply member.

11. A lithographic apparatus comprising:
a projection system configured to project a radiation beam towards the surface of a substrate; and
the fluid handling system of claim 1.

12. The fluid handling system of claim 1, wherein the liquid confinement structure comprises a body, and the vibration component is the body of the liquid confinement structure such that the mechanism is configured to vibrate the body.

13. The fluid handling system of claim 1, wherein the mechanism comprises a first mechanism and a second mechanism, the liquid confinement structure comprises a body formed of a first body element and a second body element, and the first mechanism is configured to vibrate the first body element and the second mechanism is configured to vibrate the second body element.

14. The fluid handling system of claim 13, wherein the liquid confinement structure has a longitudinal axis, and in plan, the body is separated into the first body element and the second body element along the longitudinal axis, or wherein the first body element forms an inner part of the liquid confinement structure and the second body element forms an outer part of the liquid confinement structure.

15. The fluid handling system of claim 14, wherein the first body element and the second body element are coupled to each other.

16. The fluid handling system of claim 1, wherein the liquid confinement structure comprises at least one extraction member that comprises a chamber in a surface of the liquid confinement structure facing the surface of the substrate, and a porous material within the chamber, and the at least one extraction member comprises a first channel configured to extract liquid from the chamber and a second channel configured to extract gas from the chamber.

17. The fluid handling system of claim 16, wherein the vibration component is positioned within the chamber.

18. The fluid handling system of claim 1, wherein the liquid confinement structure comprises an inner part, an outer part and at least one liquid supply member, wherein the at least one liquid supply member is formed on the inner part, and wherein the inner part comprises a first extraction member and the outer part comprises a second extraction member.

19. The fluid handling system of claim 18, wherein the outer part comprises a plate positioned between the inner part and the substrate, the plate configured to isolate liquid on either side of the plate, and wherein a surface of the inner part facing the plate comprises the first extraction member, and a surface of the plate facing the substrate comprises the second extraction member.

20. The fluid handling system of claim 18, wherein the vibration component forms at least part of the inner part and/or at least part of the outer part.

* * * * *